United States Patent [19]

Santoro et al.

[11] Patent Number: 5,570,319

[45] Date of Patent: Oct. 29, 1996

[54] EMBEDDED ACCESS TREES FOR MEMORY ARRAYS

[75] Inventors: Mark R. Santoro; Lee S. Tavrow, both of Sunnyvale; Gary W. Bewick, Palo Alto, all of Calif.

[73] Assignee: Sun Microsystems, Inc., Mountain View, Calif.

[21] Appl. No.: 522,061

[22] Filed: Aug. 31, 1995

Related U.S. Application Data

[63] Continuation of Ser. No. 276,740, Jul. 18, 1994, abandoned, which is a continuation of Ser. No. 960,616, Oct. 14, 1992, abandoned.

[51] Int. Cl.$^6$ .................................................. G11C 8/00
[52] U.S. Cl. ........................ 365/230.03; 365/190; 365/196
[58] Field of Search .................................... 365/196, 205, 365/207, 230.03, 190, 221

[56] References Cited

U.S. PATENT DOCUMENTS

| 5,132,930 | 7/1992 | Furutani et al. | 365/190 |
| 5,295,111 | 3/1994 | Tsujimoto | 365/226 |

OTHER PUBLICATIONS

"Session XVII: Megabit Drams" by Ron Raylor and Mark Johnson of Mostek Corp., 1985 IEEE Int'l. Solid–State Circuits Conf., pp. 242–243.

"Circuit Techniques for Large CSEA SRAM's" by D. Wingard et al., IEEE Journal of Solid–State Circuits, vol. 27, No. 6, Jun. 1992, pp. 908–918.

"A 1.5–ns Access Time, 78–um$^2$ Memory–Cell Size, 64–kb ECL–CMOS SRAM" by K. Yamaguchi et al., IEEE J. of Solid–State Circuits, vol. 27, No. 2, Feb. 1992, pp. 167–173.

*Primary Examiner*—David C. Nelms
*Assistant Examiner*—F. Niranjan
*Attorney, Agent, or Firm*—Philip J. McKay

[57] ABSTRACT

An improved approach for breaking the bit lines of a semiconductor memory device into small pieces, referred to herein as Embedded Access Trees (EATs), is introduced. Embedded Access Trees enjoy the principal advantage of the banked approach by dividing long bit lines into several smaller bit lines to decrease the effective load which a selected cell must drive. However, EATs avoid most of the limitations of the banked approach, e.g., increased size, power and complexity. In a preferred embodiment of the invention, EATs are embedded into the existing full array and do not require additional peripheral decoders, MUXes or complex and costly global routing. For a given processing technology, the present invention permits a full memory array to be subdivided into more subarrays than the banked approach, with corresponding performance improvements.

18 Claims, 9 Drawing Sheets

2K × 32 (8 KB) EAT SRAM Functional Blocks

2K × 32 (8 KB) EAT SRAM
Functional Blocks

EMBEDDED ACCESS TREES FOR MEMORY ARRAYS

This is a continuation of application Ser. No. 08/276,740 filed Jul. 18, 1994 now abandoned, which is a continuation of application Ser. No. 07/960,616 filed Oct. 14, 1992, now abandoned.

BACKGROUND OF THE INVENTION

FIELD OF THE INVENTION

The present invention relates to the field of semiconductor memory devices, and more particularly, to the field of random access memory devices.

BACKGROUND

The primary goal of most RAM designs is to achieve maximum memory density by implementing minimum size memory cells in the memory array. To read data from a memory cell, one row of the array is selected by driving a corresponding word line. The selected memory cell on the selected row must then drive its corresponding bit line. The bit line is loaded by all of the cells on the same column, which in current RAM designs may include as many as two hundred fifty six or more. As a result, a major percentage of read access time is spent moving the bit lines. In addition, writing to a large memory array can often limit cycle time because large voltage swings on the bit lines are required which must recover completely prior to subsequent reads.

One known approach to gaining speed is to increase the cell drive capability. However, this approach tends to make the cell larger, which in turn makes the bit lines longer, thus increasing their load. Increasing the size of the access transistor of each cell also increases the load from each cell, further increasing the overall load on the bit lines. Clearly, trying to increase the drive of the cell yields diminishing returns.

Because increasing the drive capability tends to also increase capacitance, designers have attempted another approach; reducing the voltage swing on the bit lines to gain speed. This technique, although effective, requires extremely precise circuitry to account for noise on the bit lines and also demands very high precision sense amplifiers. To accomplish this often requires many expensive and time-consuming iterations of silicon. In addition, sensing small voltage differences takes longer than sensing large voltage differences, thus reducing the actual performance gain.

Figure 1:
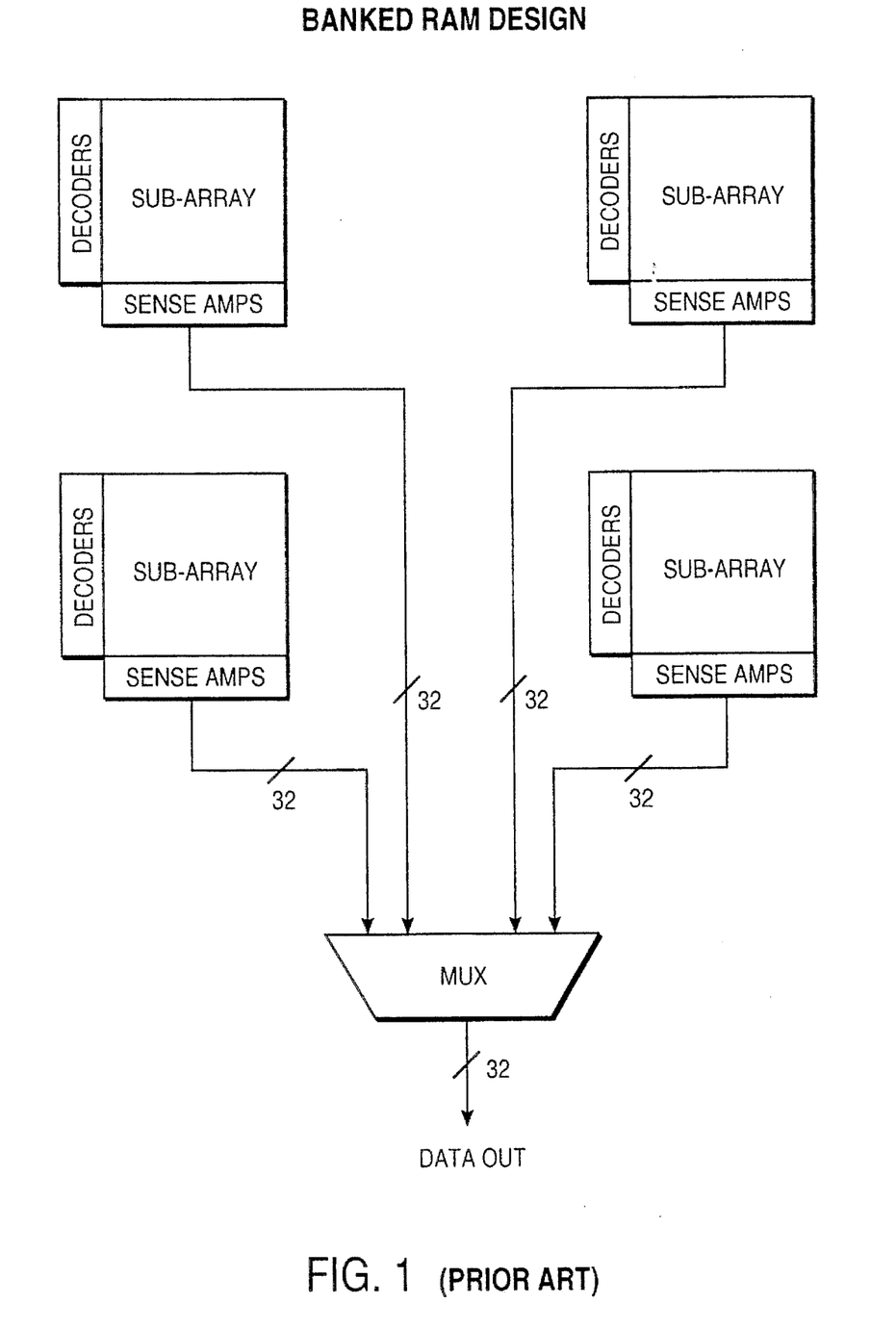
FIG. 1 illustrates the organization of a prior art Banked SRAM.

In static RAMs (SRAMs), where speed is generally very important, one additional approach that is sometimes used is Banking (see FIG. 1). In a banked design, the memory is divided into several subarrays. Their smaller size shortens the bit lines and makes each sub-array faster than a full array. The outputs from each sub-array are routed around the perimeter of the subarrays to a MUX which selects the final output.

While the banked approach provides increased speed, it does have several drawbacks. Breaking the full array into several subarrays requires more area and power. Additional decoders are required. The global routing, additional muxes, and additional sense amplifiers add to size, power, and complexity. Obviously, increasing the number of subarrays and/or increasing the number of bits accessed simultaneously from the array (e.g., in a ×4 or ×8 architecture) amplifies those problems. It would be desirable to have a RAM design that enhances the performance advantages of a banked design while minimizing the limitations thereof.

SUMMARY OF THE INVENTION

According to the present invention, an improved approach for breaking the bit lines of a semiconductor memory device into small pieces, referred to herein as Embedded Access Trees (EATs), is introduced. Embedded Access Trees enjoy the principal advantage of the banked approach by dividing long bit lines into several smaller bit lines to decrease the effective load which a selected cell must drive. However, EATs avoid most of the limitations of the banked approach, e.g., increased size, power and complexity. In a preferred embodiment of the invention, EATs are embedded into the existing full array and do not require additional peripheral decoders, MUXes or complex and costly global routing. For a given processing technology, the present invention permits a full memory array to be subdivided into more subarrays than the banked approach, with corresponding performance improvements.

The present invention provides a semiconductor memory device having an array of memory cells organized in a plurality of subarrays and circuitry for accessing the data content of the memory cells. The accessing circuitry includes a plurality of first bit lines, each associated with a column of memory cells of one of the subarrays; a plurality of second bit lines, each associated with a set of the first bit lines from a plurality of the subarrays; and a plurality of switch mechanisms for electrically connecting one of said first bit lines of the set with the associated second bit line. In this manner, the load that must be driven during a data access operation is less than the load of the full set of first bit lines. Preferably, the plurality of second bit lines and switch mechanisms are formed within the array to minimize the area impact.

The switch mechanism of the present invention preferably includes circuitry for amplifying the signal on a selected first bit line when it is connected to its associated second bit line, to further improve performance of tile device. In one embodiment of the invention, the memory cells are formed of MOS transistors, while the switch mechanisms include bipolar transistors to provide signal amplification. Additionally, the switch mechanisms may be implemented to utilize little or no static power and may be conveniently electrically connected in a logical OR configuration, and further into a multiplexor function to reduce the number of second bit lines required in the device.

A second EAT may be conveniently superimposed onto the first EAT with each sharing the first bit lines; the first EAT improving performance of the read operation and the second EAT improving performance of the write operation.

Embedded Access Trees were developed originally to speed up the read access path of SRAMs. However, the performance advantage of the present invention is useful in other applications as well. For example, Embedded Access Trees can also be used for DRAMs.

DESCRIPTION OF THE PREFERRED EMBODIMENT

Figure 2:
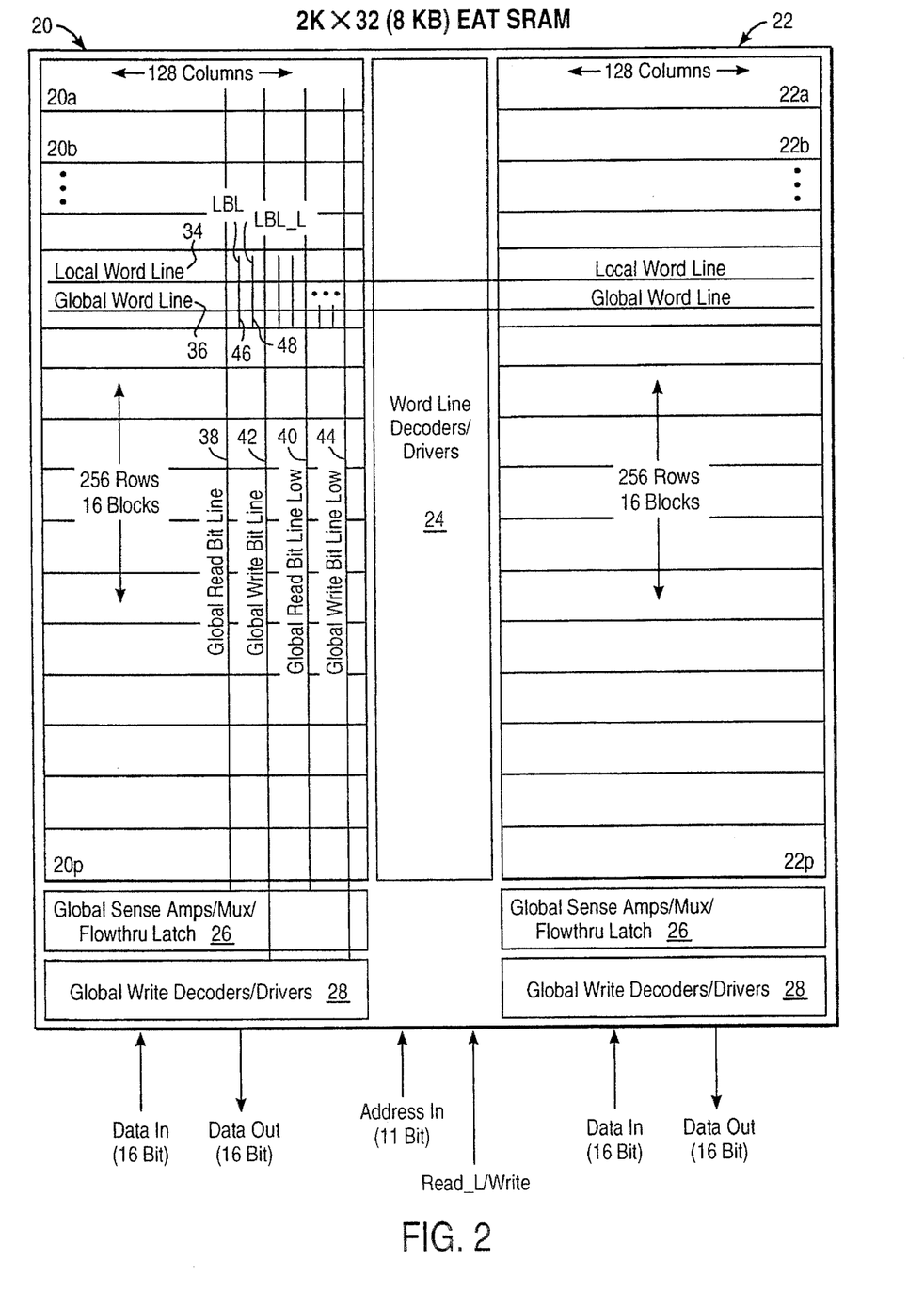
FIG. 2 is an overview of the architecture of a memory device according to the present invention.

With reference to FIG. 2, an SRAM memory device incorporating features of the present invention is illustrated, including first and second memory cell arrays 20 and 22. Although not limiting to the invention, arrays 20 and 22 each include one hundred twenty eight columns and two hundred fifty six rows of memory cells, to form a 8 KB SRAM adapted for use as a first level cache memory on a semiconductor die containing a microprocessor unit. Arrays 20 and 22 are separated by a set of Word Line Decoders/Drivers 24 and are each further subdivided into sixteen subarrays 20a–20p and 22a–22p, respectively. At the bottom of arrays 20 and 22 are located Global Sense Amp/Mux/Flowthru Latch circuitry 26 and Global Write Decoder/Driver circuitry 28. Predecoder circuitry 30 and Reference Generator circuitry 32 are located below the Word Line Decoders/Drivers 24.

Also shown in FIG. 2 are selected examples of the Bit Lines and Word Lines utilized according to the present invention. In particular, Local Word Line (LWL) 34 and Global Word Line (GWL) 36 are shown extending the width of arrays 20 and 22. Global Read Bit Line (GRBL) 38 and Global Read Bit Line Low (GRBL_L) 40 and Global Write Bit Line (GWBL) 42 and Global Write Bit Line Low (GWBL_L) 44 extend in parallel the height of array 20. In addition, as described more fully below, each sub-array 20a–20p and 22a–22p includes a plurality of Local Bit Lines (LBL) 46 and Local Bit Lines Low (LBL_L) 48 running parallel to GWBL 42 and GWBL_L 44 and extending the height of each subarray. One skilled in the art will appreciate that the bit lines and word lines required to access all of the memory cells in array 20 and 22 are not shown in FIG. 2.

Figure 3A:
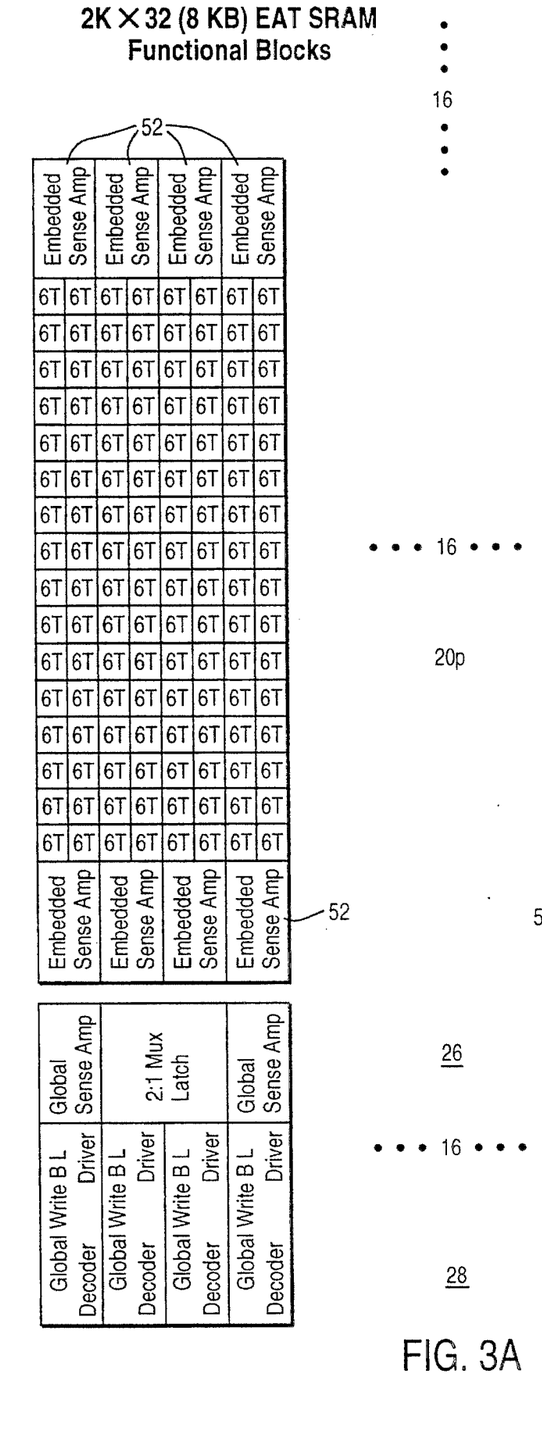
FIG. 3 is an enlarged view of the memory device of FIG. 2.
Figure 3B:
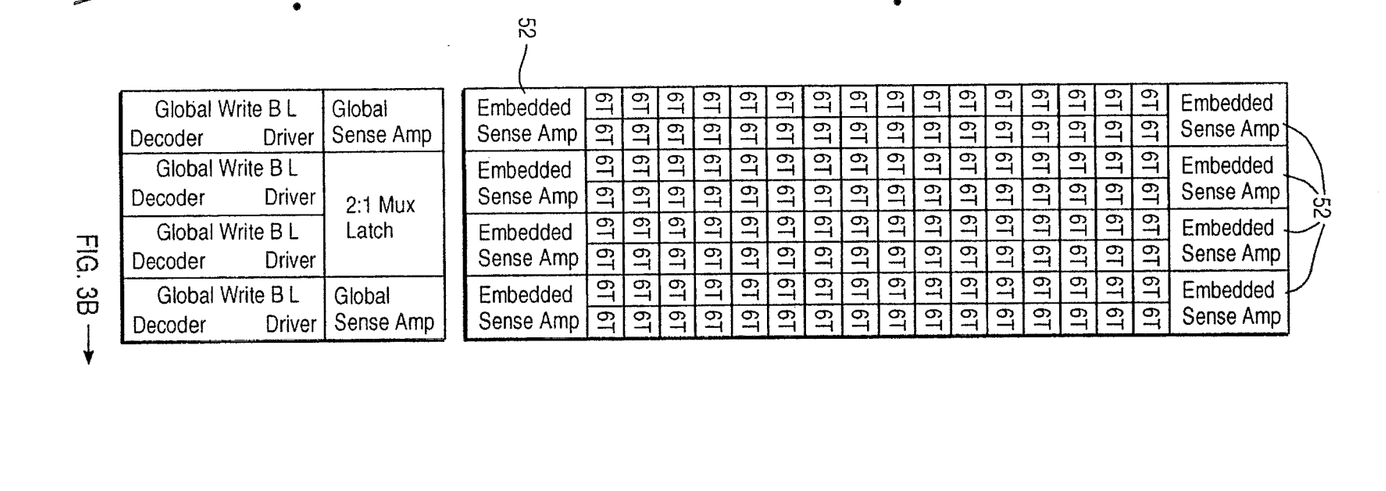
Figure 3C:
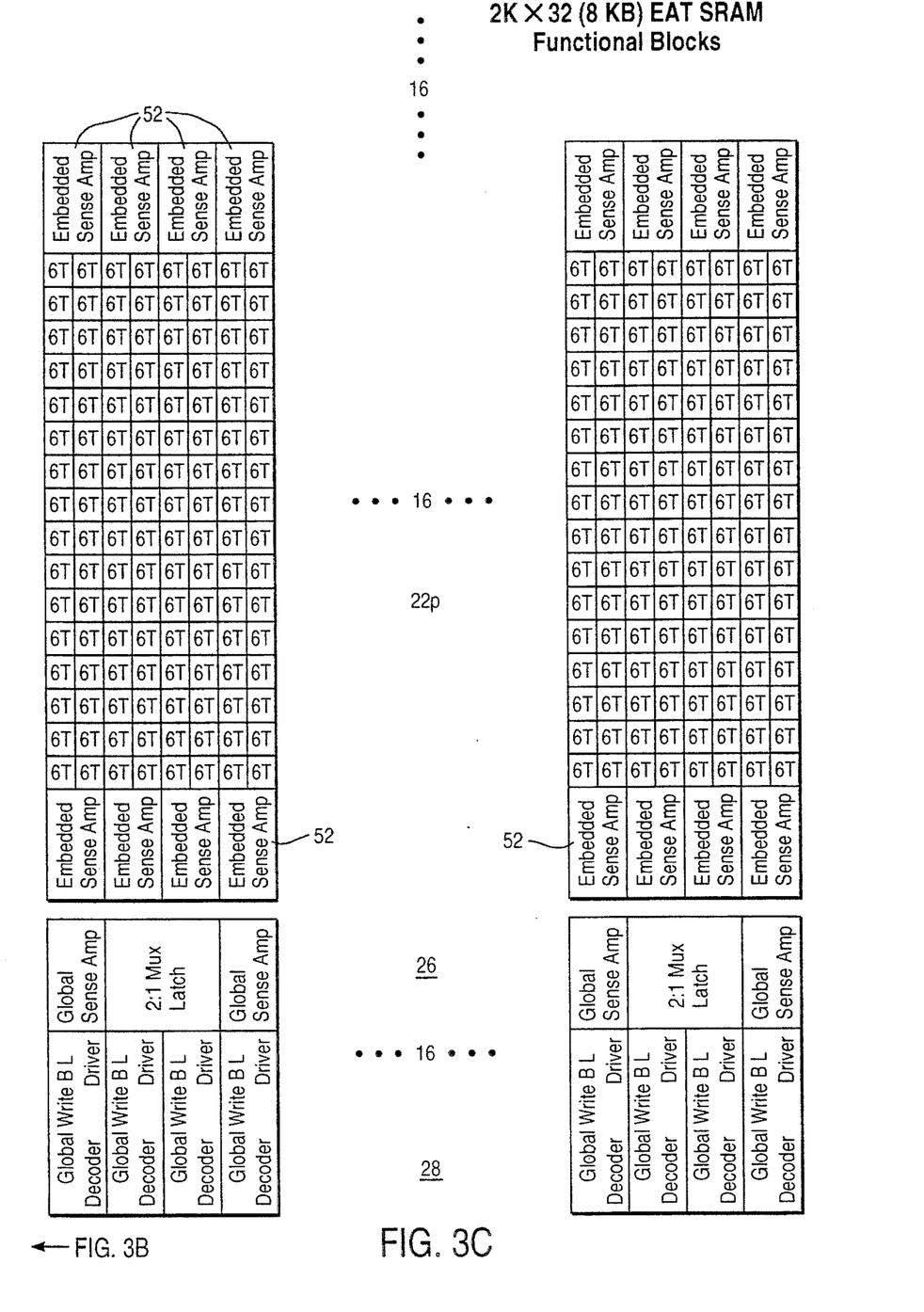

With reference to FIG. 3, a more detailed view of the subarrays 20a–20p and 22a–22p of FIG. 2 is shown. In particular, subarrays 20p and 22p are shown as rectangular arrangements of six transistor (6T) static memory cells 50, sixteen in a column and 128 per row. An Embedded Sense Amp (ESA) 52 is included for each column of cells 50, positioned at the top and bottom of each column, each ESA 52 occupying twice the pitch of a column of cells 50.

Figure 4:
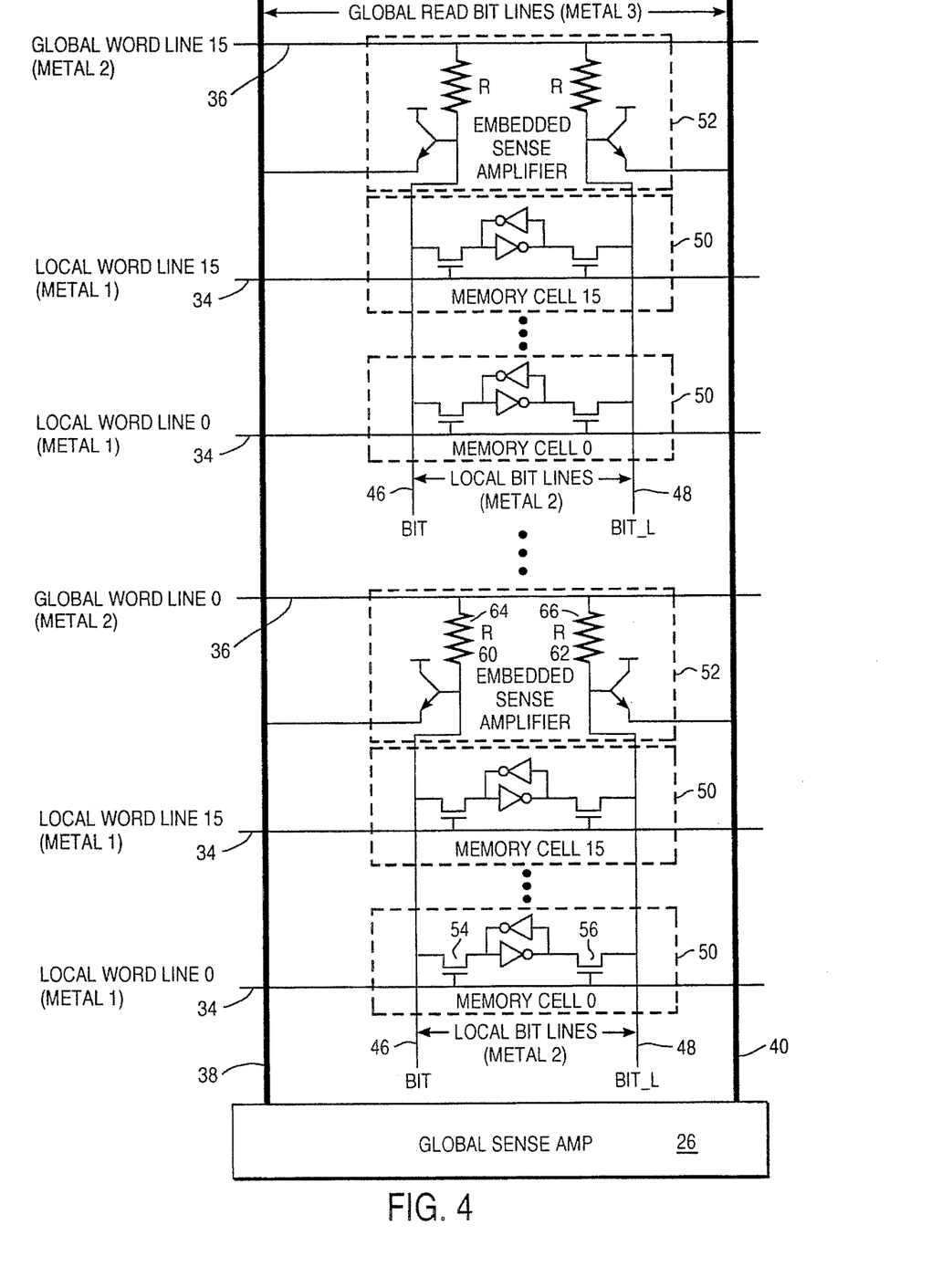
FIG. 4 is an enlarged multi-level schematic view of a portion of the memory device of FIG. 3.

With reference to FIG. 4, greater detail of a column of cells from subarrays 20a and 20p is shown, including a plurality of cells 50, each electrically connected to LBL 46 and LBL_L 48 by the sources of access transistors 54 and 56, respectively, and to LWL 34 through the gates thereof. LBL 46 and LBL_L 48 extend the height of subarray 20p (i.e., across 16 memory cells), and GRBL 38 and GRBL_L 40 extend parallel to LBL 46 and LBL_L 48 for the entire height of the array 20 (i.e., across 256 memory cells). In a preferred embodiment of the invention, as shown in FIG. 4, LWL 34 is formed in the metal 1 layer, LBL 46 and LBL_L 48 are formed in the metal 2 layer, and GRBL 38 and GRBL_L 40 are formed in the metal 3 layer of a triple metal semiconductor fabrication process.

LBL 46 and LBL_L 48 are electrically connected at one end of subarray 20p to a corresponding Embedded Sense Amp (ESA) 52, which electrically connects LBL 46 and LBL_L 48 to a corresponding GRBL 38 and GRBL_L 40 during a read operation.

In a preferred embodiment of the invention utilizing a biCMOS process, ESA 52 performs four distinct functions: it amplifies current from LBL 46 and LBL_L 48 to GRBL 38 and GRBL_L 40 during a read operation; it drives LBL 46 and LBL_L 48 during a write operation; it equilibrates LBL 46 and LBL_L 48 after a read or write operation; and it serves as a 4:1 Global Read Mux/4:1 Global Write Mux.

A simplified version of ESA 52 is illustrated in FIG. 4 to facilitate an understanding of its basic function. ESA 52 includes a pair of bipolar transistors 60 and 62, the bases of which are connected to LBL 46 and LBL_L 48, respectively, the collectors of which are connected to a voltage supply and the emitters of which are connected to GRBL 38 and GRBL_L 40, respectively. A pair of resistors 64 and 66 connect the bases of transistors 60 and 62 to GWL 36.

Each column of memory cells 50 in subarray 20a–20p includes an ESA 52 connecting its local bit lines to the corresponding global bit lines. In one alternative embodiment of a read operation, receipt of a decoded address causes one of the local word lines, LWL 34, to go high in each subarray 20a–20p. This in turn allows a selected memory cell 50 in each subarray to dump charge onto the local differential bit lines, LBL 46 and LBL_L 48, causing them to split. The local bit lines 46 and 48 feed the bases of differential bipolar pair 60 and 62. At approximately the same time that the local word lines LWL 34 switch in each subarray, one and only one global word line, GWL 36, becomes active to select the desired subarray. The selected GWL 36 going high brings the base voltage of its associated bipolar devices 60 and 62 to a higher voltage than all of the other bipolar differential pairs 60 and 62 in the ESAs 52 of the other subarrays 20a–20p. This increased base voltage gives the selected ESA 52 control of the global bit lines, GRBL 38 and GRBL_L 40 and forms a "wired OR" function. Since only one global word line GWL 36 goes high on any given read cycle, only a single ESA 52 controls the state of the global read bit lines 38 and 40. This means that the output from only one memory cell 50 on the entire column (e.g., of 256) will control the state of the global read bit lines 38 and 40.

In an alternative and preferred embodiment of a read operation, receipt of a decoded address causes one of the local word lines, LWL 34, to go high in a selected subarray 20a–20p. This in turn allows a selected memory cell 50 in the selected subarray to dump charge onto the local differential bit lines, LBL 46 and LBL_L 48, causing them to split. The local bit lines 46 and 48 feed the bases of differential bipolar pair 60 and 62. At approximately the same time that the local word lines LWL 34 switch in the selected subarray (and preferably slightly prior thereto), one and only one global word fine, GWL 36, becomes active. The selected GWL 36 going high brings the base voltage of its associated bipolar devices 60 and 62 to a higher voltage than all of the other bipolar differential pairs 60 and 62 in the ESAs 52 of the other subarrays 20a–20p. This increased base voltage gives the selected ESA 52 control of the global bit lines, GRBL 38 and GRBL_L 40 and forms a "wired OR" function. Since only one global word line GWL 36 goes high on any given read cycle, only a single ESA 52 controls the state of the global read bit lines 38 and 40. This means that the output from only one memory cell 50 on the entire column (e.g., of 256) will control the state of the global read bit lines 38 and 40.

One advantage of the ESA 52 according to the present invention is that it burns no static power, because an ESA 52 only amplifies current when its subarray 20a–20p has been selected. Non-selected ESAs 52 effectively use no power, as they drive no current into the global read bit lines 38 and 40.

Numerous alternatives exist for implementing the switching mechanism between levels of the EAT in the present invention. One approach is to use a simple MOS switch. Just as n-channel transistors are used to switch the data of memory cell 50 onto the local bit lines LBL 46 and LBL__L 48, larger n-channel transistors can be used to implement the switches between local and global read bit lines. While this is a reasonable approach, particularly in an all-MOS design, performance is limited by the additional capacitance and series resistance from the switch. Another approach is to use a standard CMOS sense amplifier as the switch mechanism. Either a clocked version, which uses no static power, or a static version could be used. The advantage of using an embedded CMOS sense amplifier for the switch mechanism is that it would also provide current and voltage gain.

For a memory device designed for fabrication in a biCMOS process, bipolar devices are available to use in designing the switch mechanism. The exponential current-voltage relationship of the bipolar transistor makes it possible to construct a switch mechanism which has a large current gain.

With continued reference to FIG. 4, an embodiment of a two level Embedded Access Tree is shown, constructed using a triple level metal fabrication process. Note that the same tree structure can be obtained using a two level metal process if both the local and global levels of the tree are formed in the same metal layer. The advantage of the additional levels of metal is that it is not necessary to decrease array density by increasing the pitch of the memory cell to make room for both the local and global bit lines in the same metal layer.

To understand why Embedded Access Trees are fast, it is beneficial to understand how EATs reduce the effective load seen by memory cell 50. In a conventional RAM each cell must drive a vertical wire (the bit line) which runs the entire height of the array. In addition, substantial capacitance is added from the sources of all of the memory cells in the same column. In accordance with the present invention, EATs reduce the load that each memory cell 50 must drive during a read operation, by limiting the number of cells on any given "branch" of the "tree" to a small number (i.e., in FIG. 4, 16 cells on each LBL 46 and LBL__L 48). Only the local branch of the tree which is selected (i.e., LBL 46 and LBL__L 48) will be connected to the global branch (i.e., GRBL 38 and GRBL__L 40) during a read operation. The result is that a selected memory cell 50 only sees the source loads from the small number of cells on its local LBL 46 and LBL__L 48, plus the wire capacitance of the local and global branch, plus a slight additional capacitance of the switch mechanism connecting the local and global bit lines of the EAT. In a preferred implementation, the total wire length tends to be only slightly longer than that of a conventional RAM design, such that the additional wire length and select mechanism add far less capacitance than the total number of cells on the other local bit lines would have.

Figure 5:
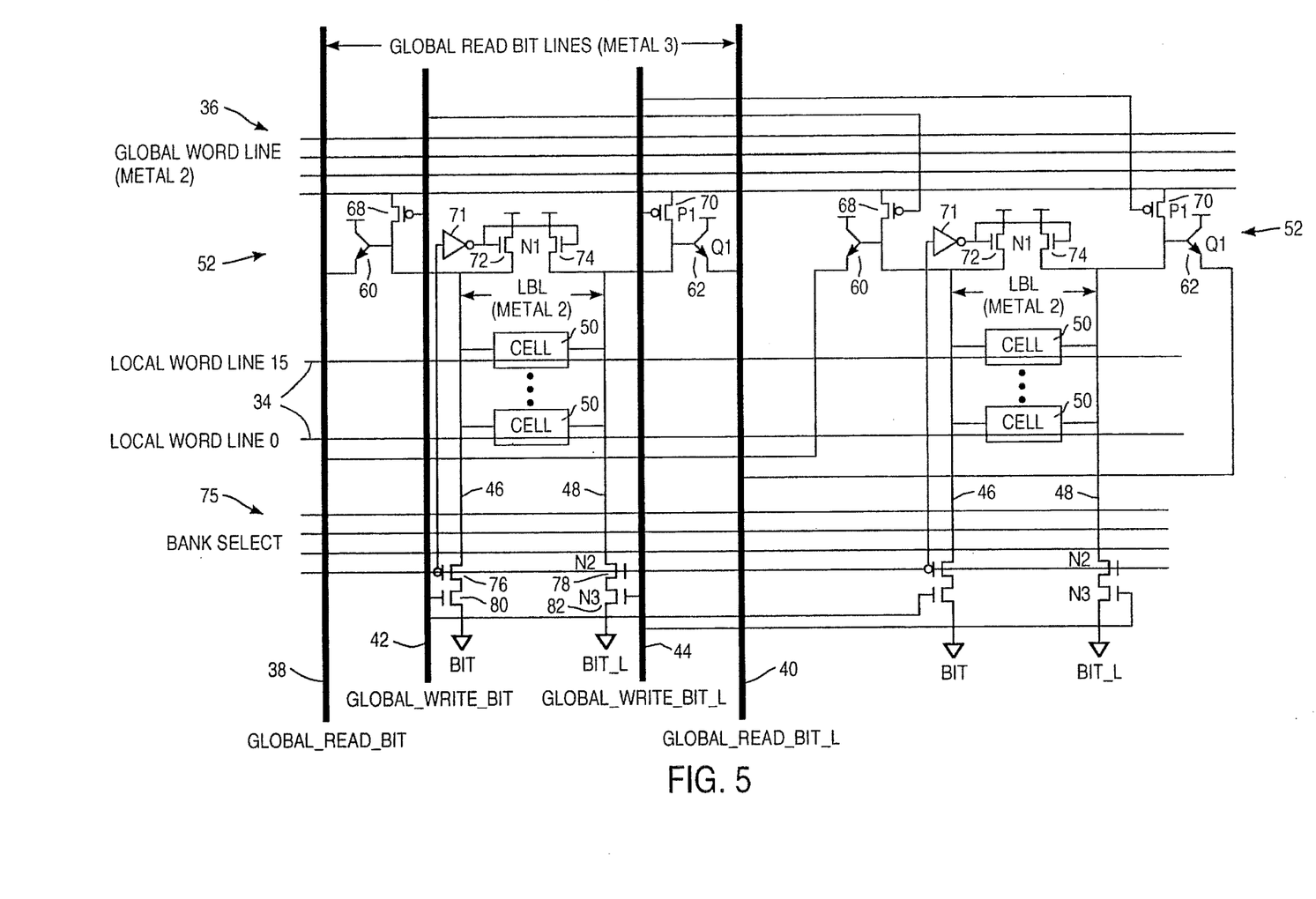
FIG. 5 illustrates the embedded sense amplifier circuitry of the memory device according to the present invention, organized to form a multiplexor function.

With reference to FIG. 5, a pair of adjacent columns of memory cells are shown, including the Global Write Bit Lines 42 and 44 (formed in metal 3) and another embodiment of the ESA 52. ESA 52 includes p-channel MOS devices 68 and 70 in place of resistors 64 and 66 in FIG. 4, in order that the resistive load can be switched off during a write operation. MOS devices 68 and 70 are then switched back on after the write operation to restore the local bit lines to their precharged values. Inverter 71 and additional n-channel MOS devices 72 and 74 are included to decrease the precharge time. When a write operation is completed, one of the local bit lines 46 and 48 is at a low level and needs to be charged back up. After the appropriate write access time, the Bank Select Signal 75 goes low, the output of invertor 71 turns on devices 72 and 74, helping the normal pull up device 68 and 70 pull up LBLs 46 or 48 respectively. Pullup transisters 72 and 74 turn off when the local bit lines 46 and 48 approach their precharged levels, and does not effect the cell's ability to pull down the local bit lines 46 and 48 during a read operation.

With continued reference to FIG. 5, ESA 52 was implemented in bipolar transistors that produce current gain. This current gain feature increases performance on reads by amplifying the current output of the memory cell. However, during a write operation, the bipolar devices 60 and 62 act like a diode clamp on the global read bit lines 38 and 40. In one embodiment of the invention, the local bit lines 46 and 48 may be required to swing full, or in a preferred embodiment, partial (2.5 v in a 3.3 v system) CMOS levels in order to write the cell. In such a case, to move the global read bit lines 38 and 40 through their CMOS swings would require techniques such as disabling the diode clamps or moving the base of the bipolar devices 60 and 62 in conjunction with lowering the global read bit lines 38 and 40. As an alternative, as shown in FIG. 5, it may be desirable to add a second two level embedded access tree to the first. This may be efficiently accomplished by sharing the lowest level of the tree, local bit lines 46 and 48, and then adding a second upper level to the two level tree in the form of Global Write Bit Line 42 and Global Write Bit Line__L 44. Thus, one skilled in the art will appreciate that Global Write Bit Lines 42 and 44 are optional elements of the present invention.

In this embodiment of the invention, a read operation occurs as before; memory cell 50 first drives the local bit lines 46 and 48. The current is then amplified through the local bipolar ESAs to drive the global read bit lines 38 and 40. The voltage differential on the global read bit lines 38 and 40 is sensed at the bottom of the full array by the global sense amplifiers 26.

Figure 6:
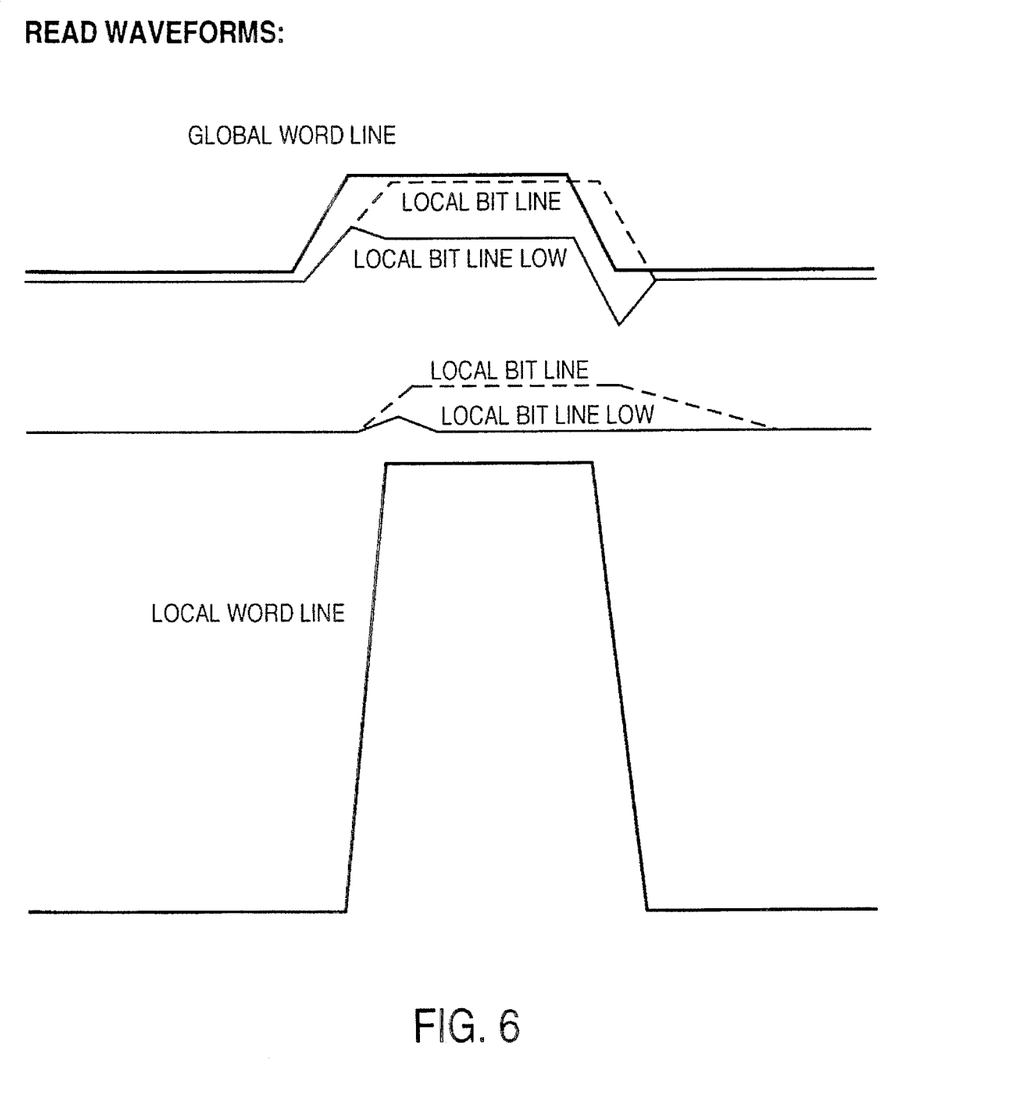
FIG. 6 is a timing diagram illustrating certain characteristics of a read operation according to the present invention.
Figure 7:
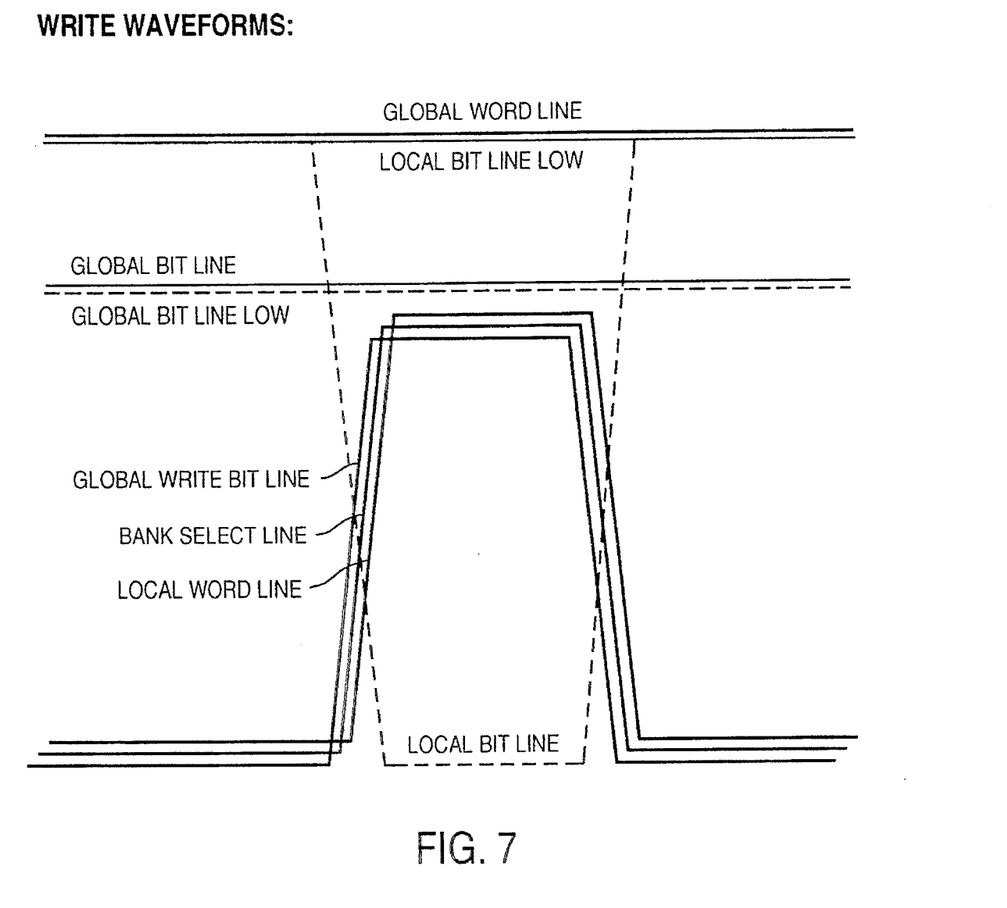
FIG. 7 is a timing diagram illustrating certain characteristics of a write operation according to the present invention.

During a write operation, the Bank__Select Line 75 goes high which selects the bank to be written by turning on the bank select access devices 76 and 78. In parallel with the bank select, and depending upon the data that is to be written, one of the global write bit lines 42 and 44 is driven through its CMOS swing from the bottom of the full array. This turns on the appropriate local bit line pull down device 80 or 82, which pulls down the appropriate local bit line 46 or 48 of the selected bank for writing. The global write bit lines 42 and 44 also turn off the local bit line precharge P-channel devices 68 and 70 and the corresponding N channel pullup devices 72 and 74 to prevent "fighting" between the P and N pullup devices and the N pulldowns 80 and 82. When the write operation is completed, the series N pulldown devices 76, 78, 80 and 82 are turned off and the P pullup and N pullup devices 68, 70, 72 and 74 are turned on in parallel to restore the local bit lines 46 and 48 to their precharged level ready for a subsequent read operation. Illustrative waveform diagrams are shown in FIGS. 6 and 7 to further describe the read and write operation of a memory device according to the present invention. Thus, a performance advantage for a write operation is gained from the same mechanism as in a read operation; reducing the effective load which must be driven. In the read access path, the driver is the selected memory cell. In the write path the selected memory cell is the receiver. As in a read operation, to write the selected cell only the branch of the tree which contains the selected cell need be driven. As a result, the load which must be moved to write the cell is much smaller and the write pulse time and the time to precharge the local bit line after the write are both substantially reduced.

An interesting feature of the memory device of the present invention is that an alternative mode of operation becomes feasible which can significantly improve access times for a high percentage of read operations. In a typical prior art memory design, it is necessary after a write operation to allow adequate time for the bit lines to recover before initiating a subsequent read operation. In the memory device according to the present invention, a high percentage of read operations can be initiated without waiting for bit line recovery, provided that the memory cell that is to be read is not located in the same subarray as the cell most recently written. Because the present invention makes feasible the division of a memory array into a large number of subarrays, each having separate sets of local bit lines, it is no longer necessary to delay a read operation during bit line recovery, if the subsequent read operation is into a different subarray. One skilled in the art will appreciate that appropriate control logic can be conveniently added to the existing decoding logic of the memory device in order to permit expedited read operations to a different subarray.

An interesting feature of the local bipolar ESA of the present invention is that its wired OR capabilities can also be utilized to advantage to form an embedded multiplexor (mux). With continued reference to FIG. 5, a simplified example of a 4:1 mux is shown, although in a preferred embodiment it may be desirable to implement a higher level mux, e.g., a 16:1 embedded mux. Rather than dedicating a Global Read Bit Line 38 and Global Read Bit Line Low 40 to each column of memory cells in a subarray, sharing of this resource can be accomplished. For example, the emitters of bipolar devices 62 from the ESAs of adjacent columns can be connected to a shared Global Read Bit Line 38 and the emitters of bipolar devices 60 from the ESAs of adjacent columns can be connected to a shared Global Read Bit Line Low 40. Control of the shared Global Read Bit Lines 38 and 40 is provided by a plurality of Global Word Lines 36, one connected to the load device of the ESA associated with each column sharing the Global Read Bit Lines. Use of this feature of the invention to form an n:1 mux reduces the number of global read bit lines 38 and 40 running over the array 20 by a factor of n. However, forming an embedded n:1 mux does requires n−1 additional global word lines 36 per subarray.

Although not shown in FIG. 5, a similar embedded mux function may be implemented to reduce the number of GlobalWrite Bit lines 42 and 44 by adding additional Bank-Select signals. For a 4:1 mux function one of the four Bank-Select signals would select one of four adjacent vertical slices to be controlled by a single set of Global_Write_Bit lines. In the event that a 4:1 mux function is implemented for both the read and write functions, each four vertical columns of memory cells 50 requires only one pair of Global Write Bit lines 42 and 44 and one pair of Global Read Bit lines 38 and 40. Thus, embedding 4:1 read and write muxes reduces the number of global bit lines, read and write, which must run the full height of the array by a factor of four. Accordingly, implementation of embedded read and write trees according to the present invention would require on average only one extra vertical wire per memory cell 50.

CONCLUSION

By reducing the effective bit line capacitance which a memory cell must drive, the Embedded Access Tree RAM of the present invention produces much faster access times than conventional RAM designs, with only a small area penalty. The embedded character of the invention eliminates the routing and overhead complexity found in banked RAM designs, thereby permitting smaller subarrays to be used than in banked RAM designs, thus reducing the effective capacitance of the bit lines and further reducing access time. The invention includes a novel biCMOS design to implement an embedded local sense amplifier that burns zero static power and provides current gain to further increase performance. The unique nature of the local sense amplifier design allows it to also act as an embedded multiplexor which reduces the number of global read bit lines and global write bit lines by a factor of n (e.g., 4). For write operations, a second embedded tree may be superimposed over the first to provide a fast write path. Simulations indicate that the embedded access trees of the present invention may increase performance by more than a factor of two while increasing the array size by about 30%. A memory device according to the present invention is expected to be smaller than the same RAM would be using the banked approach, because the mux and sense amp structures are embedded in the array, allowing the periphery of the RAM implemented using EAT to be considerably smaller than in the banked approach.

The EAT structure of the present invention breaks the capacitive loads on the bit lines into much smaller portions than is possible with the external banked approach of the prior art. In addition, EATs do not have the global routing or muxing limitations associated with externally banked RAMS.

Although the detailed description included herein relates specifically to an SRAM design, the techniques of the present invention may also be valuable in the design of DRAMs. The principal difference with DRAMs is that array density is generally even more important that in SRAMs. Because DRAMs have a much narrower cell pitch, if limited to currently available semiconductor fabrication techniques it may be more difficult to route the additional vertical wires without an area impact.

EATs can also be used to speed up the write path of the cell. For example, if bidirectional switches are used to form the ESA, the same access path can be used for the write operation as was used for the read operations. As only the local branch containing the cell to be written needs to be driven, the reduction in effective capacitance will make the write operation faster just as it made the read operation faster.

There are other uses of the present invention as well. For example, a similar tree structure could be used on the word lines that drive the access devices. The first level of the tree would normally do only a partial decode, although a full decode does not change the basic structure, with additional decoding used to switch on the appropriate branches of the tree. The advantage is similar to that of the access path: reduced load on the driver. More specifically, the word line driver would only see the access devices from one of the lowest branches of the tree. Additional load would of course be seen from the additional wires and switch mechanisms, as before.

What is claimed is:

1. A circuit comprising:
    a select line;
    a bit line coupled to a memory cell;

a bipolar transistor having a base coupled to the bit line; and a passive element coupled between the base of the bipolar transistor and the select line to activate the bipolar transistor when the select line is selected.

2. The circuit of claim 1, wherein the passive element is a resistor.

3. The circuit of claim 1, wherein the passive element is a first transistor.

4. The circuit of claim 3, wherein the first transistor has a control electrode coupled to a write bit line for deactivating the bipolar transistor during a write operation to the memory cell.

5. The circuit of claim 1, wherein the bipolar transistor acts as a sense amplifier for sensing the data on the bit line during a read operation of the memory cell.

6. The circuit of claim 1, further comprising a precharge circuit coupled to the bit line for precharging the bit line prior to a read operation of the memory cell.

7. The circuit of claim 6, wherein the precharge circuit comprises a precharge transistor coupled to the bit line.

8. The circuit of claim 7, further comprising a write bit line coupled to the precharge transistor configured to deactivate the precharge transistor during a write operation to the memory cell.

9. The circuit of claim 1, further comprising a pull up circuit to pull up the bit line after a write operation of the memory cell.

10. The circuit of claim 9, wherein the pull up circuit comprises a pull up transistor coupled between the bit line and a control circuit for deactivating the pull up transistor during a write operation to the memory cell.

11. The circuit of claim 1, further comprising a pull down transistor, coupled to the bit line, for pulling down the bit line during a write operation to the memory cell.

12. The circuit of claim 1, further comprising a bank select transistor, coupled to the bit line, configured to select a bank of memory cells including the memory cell.

13. The circuit of claim 1, wherein the select select line is used to activate a subarray of memory cells including the memory cell.

14. The circuit of claim 1, further comprising:

a differential bit line coupled to the memory cell;

a second bipolar transistor having a second base coupled to the differential bit line; and a second passive element coupled between the second base of the second bipolar transistor and the select line to activate the second bipolar transistor when the select line is selected.

15. The circuit of claim 1, wherein a first electrode of the bipolar transistor is coupled to a power supply and a second electrode of the bipolar transistor is coupled to a global bit line.

16. A method of providing a circuit, the method comprising the steps of:

providing a select line;

providing a bit line coupled to a memory cell; providing a bipolar transistor having a base coupled to the bit line; and providing a passive element coupled between the base of the bipolar transistor and the select line to activate the bipolar transistor when the select line is selected.

17. The method of claim 16, further comprising the steps of:

providing a differential bit line coupled to the memory cell;

providing a second bipolar transistor having a second base coupled to the differential bit line; and providing a second passive element coupled between the second base of the second bipolar transistor and the select line to activate the second bipolar transistor when the select line is selected.

18. A method of operating a memory array, comprising the steps of:

selecting a select line;

activating a bipolar transistor through a passive element coupled between the select line and a base of the bipolar transistor;

activating a bit line in response to the step of activating the bipolar transistor; and reading a memory cell on the bit line.

* * * * *